United States Patent
van der Weide et al.

(10) Patent No.: US 7,146,282 B1
(45) Date of Patent: Dec. 5, 2006

(54) MECHANICAL FORCE DETECTION OF MAGNETIC FIELDS USING HETERODYNE DEMODULATION

(75) Inventors: Daniel W. van der Weide, Madison, WI (US); Charles A. Paulson, Clearlake, MN (US); Thomas M. Grist, Madison, WI (US); Modhurin Banerjee, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/124,599

(22) Filed: May 6, 2005

(51) Int. Cl.
 *G06F 19/00* (2006.01)
 *G01R 27/00* (2006.01)
(52) U.S. Cl. .......................... 702/56; 702/65
(58) Field of Classification Search ................ 702/33, 702/54, 56, 65; 250/306; 73/862, 639; 324/244, 324/309
See application file for complete search history.

(56) References Cited

U.S. PATENT DOCUMENTS

| | | | |
|---|---|---|---|
| 5,166,615 A | 11/1992 | Sidles | |
| 5,266,896 A | 11/1993 | Rugar et al. | |
| 5,465,046 A | 11/1995 | Campbell et al. | |
| 5,900,728 A | 5/1999 | Moser et al. | |
| 5,936,237 A | 8/1999 | Van der Weide | |
| 5,983,712 A | 11/1999 | Lindsay et al. | |
| 6,181,131 B1 | 1/2001 | Bruland et al. | |
| 6,668,627 B1 | 12/2003 | Lange et al. | |
| 6,862,923 B1 * | 3/2005 | Buguin et al. | 73/105 |

OTHER PUBLICATIONS

A.S. Hou, F. Ko and D.M. Bloom, "Pipcosecond Electrial Sampling Using a Scanning Force Microscope", Electronics Letters, vol. 28, No. 25, pp. 2302-2303, Dec. 3, 1992.
G. E. Bridges, R. A. Said, and D. J. Thompson, "Heterodyne Electrostatic Force Microscopy for Non-Contact High Frequency Integrated Circuit Measurement", Electronics Letters, vol. 29, No. 16, pp. 1448-1449, Aug. 5, 1993.
F. Ho, A.S. Hou, and D. M. Bloom, "High-Speed Integrated Circuit Probing Using a Scanning Force Microscope Sampler", Electronics Letters, vol. 30, No. 7, pp. 560-562, Mar. 31, 1994.
Louis A. Madsen, "Force-Detected NMR in a Homogeneous Field: Experiment Design, Apparatus, and Observations", Thesis for California Institute of Technology, Pasadena, CA, Feb. 19, 2002.

* cited by examiner

Primary Examiner—Michael Nghiem
(74) Attorney, Agent, or Firm—Foley & Lardner LLP

(57) ABSTRACT

Localized magnetic fields are measured at frequencies into the microwave (GHz) regime using a conductive loop that is integrated on a vibratable member, such as a cantilever. Driving an alternating current at a first high frequency through the loop produces a high frequency alternating magnetic dipole at the same frequency as the current, with the alternating magnetic dipole normal to and centered within the loop. The alternating magnetic dipole at the center of the loop mixes with a sampled alternating magnetic field at a second high frequency at the center of the loop, resulting in application of a mechanical force to the loop and vibratable member. The vibratable member vibrates when the difference between the frequency of the loop current and the frequency of the sampled alternating magnetic field equals the resonant frequency of the vibratable member.

50 Claims, 8 Drawing Sheets

MECHANICAL FORCE DETECTION OF MAGNETIC FIELDS USING HETERODYNE DEMODULATION

REFERENCE TO GOVERNMENT RIGHTS

This invention was made with United States government support awarded by the following agencies:

| DOD ARPA | N[[C]]00014-02-1-0602 |
|---|---|
| NSF | 0210449 |
| USAF/AFOSR F | 49620-03-1-0420 |

The United States government has certain rights in this invention.

FIELD OF THE INVENTION

The present invention relates generally to detection of high frequency magnetic fields.

BACKGROUND OF THE INVENTION

Over the past few decades, the practice of medicine has been transformed by development of new medical imaging technologies, such as magnetic resonance imaging ("MRI"). MRI can provide detailed pictures of the interior of a living body, reducing the need for exploratory surgery and providing tools for more accurate and timely diagnosis of disease or injury. Besides imaging relatively static tissue, new MRI techniques have been, and continue to be, developed that allow imaging of dynamic activity in the body, such as heart function, brain activity, or blood flow.

MRI is based on a physical phenomenon known as nuclear magnetic resonance ("NMR") which relates to the quantum mechanics of nuclear spin. Any atomic nucleus with an odd number of neutrons, an odd number of protons, or both, has a net magnetic moment, making such an atomic nucleus "NMR active" and usable for MRI imaging. In practice, $^1$H ("proton") nucleus is the most widely used for imaging of the human body. The $^1$H ("proton") nucleus is attractive because all living organisms contain an abundance of hydrogen and associated $^1$H nuclei, and because the properties of $^1$H give rise to relatively strong NMR signals. FIGS. 1–4 illustrate some of the basic physics exploited by NMR and MRI devices in the prior art.

In the absence of a magnetic field $\overline{B}_0$ in other words when $|\overline{B}_0|=0$ as shown in FIG. 1(a), the magnetic moments $\overline{m}_i$ of NMR-active nuclei will be randomly oriented in all directions. Because the magnetic moments $\overline{m}_i$ are all randomly oriented in FIG. 1(a), the magnetic moments of all the nuclei in FIG. 1(a) cancel each other out, so that the aggregate magnetic moment is zero.

When a static magnetic field $\overline{B}_0$ is applied, in other words when $|\overline{B}_0|\neq 0$ as shown in FIG. 1(b), the magnetic moments $\overline{m}_i$ of the NMR-active nuclei tend to align parallel or anti-parallel to the direction of the magnetic field $\overline{B}_0$. A slightly higher proportion of the NMR-active nuclei align parallel to the magnetic field, so that the magnetic moments $\overline{m}_i$ of all the NMR-active nuclei in FIG. 1(b) do not cancel each other out in aggregate. Instead, the aggregated magnetic moments $\overline{m}_i$ of all the NMR-active nuclei in FIG. 1(b) form an aggregate net magnetization $\overline{M}$ as shown in FIG. 1(c).

The aligned nuclei in the static magnetic field exhibit a resonance phenomenon at a specific resonance frequency determined by the Larmor relationship [Eq. 1], where f is the resonance frequency of the nucleus in the static magnetic field, γ is a proportionality constant that depends on the nucleus, and $|\overline{B}_0|$ is the magnitude of the static magnetic field. For $^1$H, the proportionality constant γ is 42.58 MHz/T so a $^1$H nucleus in a 2T static magnetic field has a resonant frequency f=85.16 MHz.

$$f=\gamma|\overline{B}_0| \qquad [\text{Eq. 1}]$$

Because of this resonance phenomenon, if a $^1$H nucleus in a 2T static magnetic field is subjected to an oscillating magnetic field $\overline{B}_{excite}$ at 85.16 MHz, that $^1$H nucleus will absorb energy from the oscillating magnetic field $\overline{B}_{excite}$. Such an oscillating magnetic field $\overline{B}_{excite}$ orthogonal to the static magnetic field $\overline{B}_0$ can be provided, for example, by passing an oscillating current i(t) at 85.16 MHz through an excitation coil, as shown in FIG. 2. This process is known as "excitation," and after absorbing energy the nucleus is said to be "excited." The excitation energy will affect a portion of the NMR-active nuclei in two ways: it will tip the magnetization vector $\overline{m}$ of some of the nuclei 90° and it will flip the magnetization vector of other nuclei 180°.

The 90°-tipped nuclei have a magnetization vector $\overline{m}$ with a "transverse" component $m_{xy}$ (in the plane perpendicular to the static magnetic field $\overline{B}_0$ in the z direction) and a "longitudinal" component $m_z$ (parallel to the static magnetic field $\overline{B}_0$) as shown in FIG. 2. The tipped magnetization vectors $\overline{m}_i$ of these 90°-tipped nuclei precess in phase around the static magnetic field $\overline{B}_0$ at the resonance frequency f.

If a signal detection coil is placed nearby as shown in FIG. 2, the aggregated in-phase precession of the 90°-tipped nuclei results in a time-varying magnetic field that induces a corresponding signal voltage s(t) in the signal coil at the resonance frequency f. When the excitation from the oscillating magnetic field $\overline{B}_{excite}$ is removed, the signal voltage s(t) does not stop instantaneously, but instead it decays exponentially with a time constant T2 as the 90°-tipped magnetization vectors of the nuclei fall out of phase with one another and the nuclei return to their pre-excitation state.

In some prior art MRI and NMR devices, the same coil is used both for excitation and for measurement. That is, the same coil can be used first to carry an excitation current to create the oscillating magnetic field, then the excitation current can be turned off so that the same coil can be used to measure the induced signal voltage. However, this is not required and separate coils can be used for excitation and signal detection as shown in FIG. 2.

The 180°-tipped nuclei have a magnetization vector which has been completely flipped 180°, so that these magnetization vectors do not include any transverse components. The effect of flipping some of the nuclei 180° is to reduce the aggregate magnetization $\overline{M}$ compared to what it would be without the excitation field $\overline{B}_{excite}$. When the excitation field $\overline{B}_{excite}$ is removed, the reduced aggregate magnetization $\overline{M}$ does not recover instantaneously. Instead, $\overline{M}$ increases exponentially with a time constant T1 until it returns to its equilibrium state in the absence of the excitation field $\overline{B}_{excite}$.

The environment surrounding the nuclei, for example the chemical composition of the tissues containing the nuclei, as well as the relative concentration of the NMR-active nuclei being excited, affects how the tissue reacts to the excitation. For example, the time constant T2 of the decay of the transverse components in the 90°-tipped nuclei is different for different types of tissues. Similarly, the time constant T1 of the return to normalcy of the 180°-tipped nuclei depends on the material containing the nuclei. By measuring the T1 and T2 properties of the tissue at a given position, it is possible to differentiate, for example, healthy tissue from cancerous tissue, or fat from muscle.

One-dimensional spatial localization in MRI can be accomplished by varying the magnitude of the static magnetic field |B₀| in that dimension across the region being imaged, as shown in FIG. 3. For example, the magnitude of the static magnetic field |B₀| may not be uniform, but instead it may increase linearly in a region as a function of position x according to [Eq. 2], where B(x) is the magnitude of the static magnetic field at position x, $B_0$ is the magnitude of the static magnetic field at position x=0, and G is the magnetic field gradient across the region:

$$B(x)=B_0+Gx \quad [Eq.\ 2]$$

By combining [Eq. 1] and [Eq. 2], it follows that a linear variation of the magnitude of the static magnetic field in the region according to [Eq. 2] results in a corresponding variation of the resonant frequency of NMR-active nuclei in that region according to [Eq. 3]:

$$f(x)=\gamma(B_0+Gx) \quad [Eq.\ 3]$$

For example, if $B_0$=2T, and G=0.2T/m, then the resonant frequency of the ¹H nucleus in the 2T static magnetic field at position x=0 m will be 85.16 MHz. The resonant frequency of the ¹H nucleus in the 2.2T static magnetic field at position x=1 m will be higher, 93.68 MHz, because of the increased static magnetic field at that position. Although the ¹H nucleus is used in this example calculation, this effect is not specific to any particular NMR-active nucleus, and the resonant frequency of other NMR-active nuclei can be varied in a similar fashion.

This variation in the resonant frequency of the NMR-active nuclei can enable selective excitation as a function of position. For example, if an oscillating magnetic field at a single frequency of 85.16 MHz is applied to the region, only those nuclei at position x=0 will be excited. Because only those nuclei at position x=0 will be excited, the corresponding induced voltage in a coil will have frequency components at that single frequency and will come from those nuclei at that specific position.

Similarly, if an oscillating magnetic field having components at all frequencies across the range 85.16 MHz through 93.68 MHz is applied to the region, all the nuclei from position x=0 m to position x=1 m will be excited. The resulting induced voltage in a coil will have frequency components at all frequencies across the range 85.16 MHz through 93.68 MHz since this induced voltage will come from nuclei at all positions between x=0 m and position x=1 m. By measuring the frequency content of the induced coil, for example using a spectrum analyzer or a bandpass filter, the magnitude of the induced coil voltage at a specific position or range of positions can be detected, as illustrated in FIG. 4.

Other techniques known in the art, such as phase encoding or selective excitation in a particular slice, provide localization in two and three dimensions. No matter how many dimensions are used, however, it can be seen that the spatial resolution of the system depends at least in part on the selectivity of a spectrum analyzer or narrow bandpass filter. For example, if a narrow bandpass filter or spectrum analyzer is able to select 100 different frequencies uniformly distributed in the range 85.16 MHz through 93.68 MHz, it follows that the spatial resolution of the frequency-encoding system will be approximately 1/100 m, or 1 cm.

Thus, there is a need for methods and devices able to detect alternating magnetic fields in extremely narrow frequency ranges, to thereby provide improved spatial resolution of MRI devices. What is further needed is a magnetic field sensor having improved sensitivity and a lower noise floor compared to inductive coil sensors. What is further needed is a magnetic field sensor which minimizes the amount of metal in the vicinity of the MRI magnetic field.

SUMMARY OF THE INVENTION

An exemplary embodiment of the invention relates to a device and method for mechanical force detection of a spatially localized, high frequency alternating magnetic field $B_{signal}$ at a frequency $\omega_{signal}$, through heterodyne demodulation using a conductive loop carrying an alternating current at a frequency $\omega_{loop}$ and borne on a probe cantilever having a mechanical resonant frequency $\omega_{mech}$. By choosing the frequency of the loop current to be stoop $\omega_{loop} \approx \omega_{signal} + \omega_{mech}$ or $\omega_{loop} \approx \omega_{signal} - \omega_{mech}$, the cantilever and loop act as a mechanical heterodyne receiver, whereby the magnitude of the mechanical vibration of the cantilever at its mechanical resonant frequency reflects the magnitude of the magnetic field $B_{signal}$ at a frequency $\omega_{signal}$.

In an exemplary embodiment, a method according to the invention comprises providing a conductive loop on a vibratable member having a mechanical resonant frequency $\omega_{mech}$; driving an alternating current at a frequency $\omega_{loop} \approx \omega_{signal} + \omega_{mech}$ or $\omega_{loop} \approx \omega_{signal} - \omega_{mech}$ through the loop to create an alternating magnetic field $B_{loop}$ in the loop which interacts with the alternating magnetic field $B_{signal}$ to cause the vibratable member to vibrate; and detecting the magnitude of that vibration.

In an exemplary embodiment, a device according to the invention comprises a conductive loop on a vibratable member with a mechanical resonant frequency $\omega_{mech}$; a current source providing an alternating current through the conductive loop at frequency $\omega_{loop} \approx \omega_{signal} + \omega_{mech}$ or $\omega_{loop} \approx \omega_{signal} - \omega_{mech}$ to create an alternating magnetic field $B_{loop}$ in the loop which interacts with $B_{signal}$ to cause the cantilever to vibrate at its mechanical resonant frequencyt $\omega_{mesh}$; and a vibration sensor for detecting the magnitude of vibration of the cantilever and providing an output signal reflecting the magnitude of the cantilever vibration.

In preferred embodiments of a method and device according to the invention, the vibratable member is preferably, but not necessarily, a cantilever beam having a first end clamped to a support and a second free end with $\omega_{mech}$ between 10 kHz and 1 MHz.

In a particularly preferred embodiment, the free end of the cantilever has a reflective portion, and detection of the vibration of the cantilever is performed by reflecting a laser beam off the reflective portion of the cantilever to a photodetector producing an output signal that reflects the magnitude of the vibration of the cantilever. The conductive loop is preferably, but not necessarily, positioned on the cantilever between the reflective portion and the first end of the cantilever. Especially for MRI devices, the frequency of the loop current is preferably in the range of Larmor frequencies for the NMR-active nuclei of interest, for example between 10 MHz and 1 GHz.

A method and device according to the invention can be adapted for NMR analysis of an object containing NMR-active nuclei by subjecting the object to a static magnetic field $B_0$ to align NMR-active nuclei with the static magnetic field; and applying RF energy at the Larmor frequency to excite at least a portion of the NMR-active nuclei; whereby the NMR-active nuclei in the excited state emit the alternating magnetic field $B_{signal}$ at frequency $\omega_{signal}$ signal as they return to their pre-excitation state.

A method and device according to the invention can also be adapted for MRI imaging of the object in one dimension x by subjecting the object to a gradient magnetic field B(x) whereby the Larmor frequencies of the NMR-active nuclei in the object fall within a range of Larmor frequencies; and iteratively repeating (or performing in parallel) the RF excitation and measurement steps at different frequencies $\omega_{signal}$ in the range of Larmor frequencies in the object to excite only those NMR-active nuclei having a Larmor frequency which coincides with the frequency of the RF energy.

Our new method for the detection of magnetic fields can be particularly useful in the high frequency (e.g. >1 GHz) regime where it is more difficult to design magnetic field sensors. High frequency magnetic fields must be detected in magnetic resonance imaging (MRI) machines, nuclear magnetic resonance instruments (NMR), magnetic resonance force microscopes, and in high frequency integrated circuits, to cite a few examples.

The most common MRI sensors in use today are based on inductive coils, where the current induced in a coil is measured, and a magnetic field is inferred from this measurement. The noise floor of this measurement is well understood and discussed at length in the literature. The most direct way to increase the sensitivity of an inductive coil is to increase the number of turns on wire in the coil. Unfortunately, increasing the number of turns of wire will increase the amount of metallic material in the vicinity of the MRI machine, which is undesirable.

A device and method according to the invention can have one or more advantages over the prior art, including improvements in noise floor and spatial resolution. A device and method according to the invention can also have one or more characteristics which make the device and method suitable for use in MRI and NMR applications, including compact size, parallel manufacture to allow simultaneous parallel detection, and operation in an MRI or NMR environment.

Because a device and method according to the invention uses mechanical force to detect magnetic field, its noise floor is set by mechanics, and not by the electrical properties of the loop. The force detected method, based on application of magnetic force resonantly to a harmonic oscillator, increases the interaction time of the sample with the detector and minimizes thermal noise. Further, a device and method according to the invention can provide a very selective (high-Q) narrow bandpass filter, which rejects non-signal noise at frequencies other than the frequency of interest.

In contrast, the noise floor for inductive detection depends on the resistivity of the metal and the size and number of turns of the loop. While it is possible to implement a narrow band electronic filter with inductive loop detection, the maximum selectivity (Q) of electronic filters will generally be lower than the maximum selectivity (Q) which can be achieved with a device and method according to the invention. Thus, a device and method according to the invention can provide an better noise floor compared to prior art inductive coil devices.

A device and method according to the invention can also provide improved spatial resolution compared to prior art devices. From a mechanical standpoint, the detection of magnetic fields in the invention can take place close to the end of a mechanical cantilever, where the forces causing mechanical vibration will have maximum effect. This can help localize the detection of magnetic fields to an area at the very end of the cantilever, which is only a few microns-square. From an electromagnetic point of view, the mechanical force arises from the field in the loop, which exists within the loop, and is no bigger than the loop itself. So, both electromagnetically and mechanically, the external magnetic field is being sensed in an area that is only about the size of the loop, which is six microns in diameter, and which can be scaled down further with improvements in lithography.

Because a device and method according to the invention can be fabricated using standard microfabrication techniques, multiple cantilevers and loops can be fabricated together and integrated together in a single device. A parallel device of this type can allow simultaneous parallel detection of multiple frequencies, for example by varying the resonant frequency of the cantilevers or vibratable members, or by varying the frequency of the alternating currents applied to the loops. Such a device, whether parallel or unitary, can also be very compact in size, for example to allow it to be placed in closer proximity to a patient or object being imaged or analyzed compared to prior art devices.

A device and method according to the invention can also be well suited for operation in an MRI or NMR environment, for example where large static magnetic fields are present. A sensor according to the invention can be constructed with less metal in the immediate vicinity of the MRI chamber compared to prior art coils which incorporate multiple turns of metal wire. Use of an optical detection method can allow the optical vibration signal to be transported outside the immediate vicinity of the MRI chamber, for example using fiber optics, where it can be detected and processed using components that can be remote from the strong magnetic fields in the chamber.

Similarly, even if the vibration signal is not received optically, or if the vibration is received optically with a photodetector in the immediate vicinity of the MRI chamber, the resulting electronic vibration signal can be in the kHz or low MHz range, instead of the high MHz range of ordinary MRI or NMR signals. These advantages that flow from reduced signal frequency and optical signal transmission can help overcome limitations of prior art devices, such as losses or noise in transmission cables or existing NMR coils, especially for parallel imaging with large numbers of sensors.

Other features and advantages of the invention will become apparent to those skilled in the art upon review of the following drawings, the detailed description, and the appended claims.

DETAILED DESCRIPTION OF THE INVENTION

Figure 1:
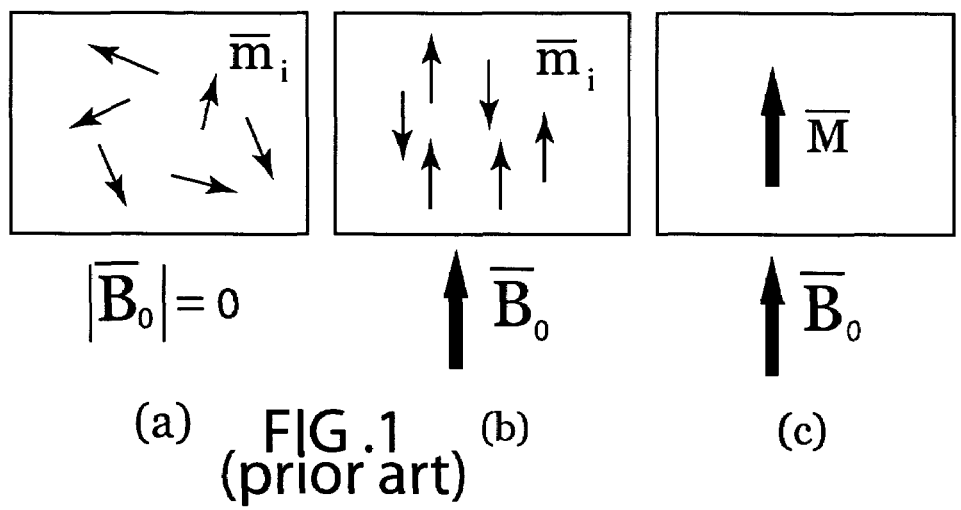
FIGS. 1(a), 1(b), and 1(c) illustrate the orientation of the magnetic moments of NMR-active nuclei with and without application of a static magnetic field, as known in the prior art.
Figure 2:
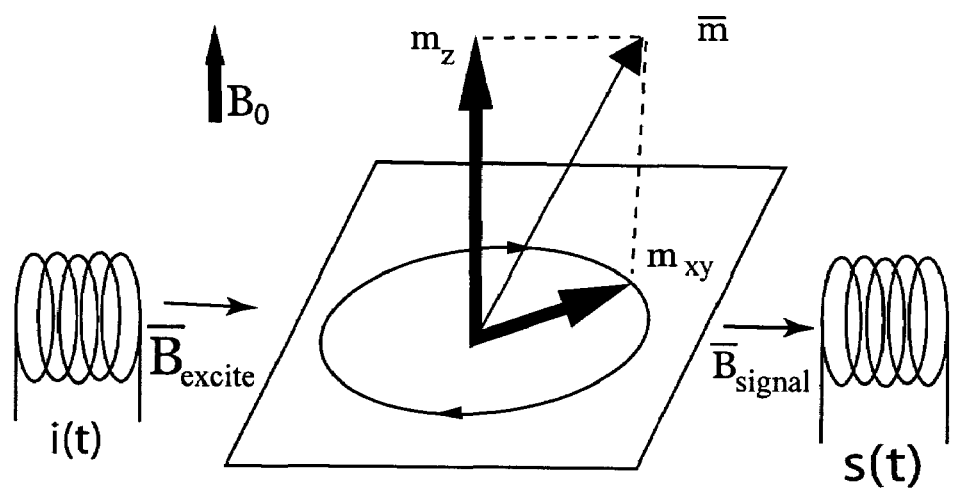
FIG. 2 illustrates the basic physics of nuclear magnetic resonance imaging, as known in the prior art.
Figure 3:
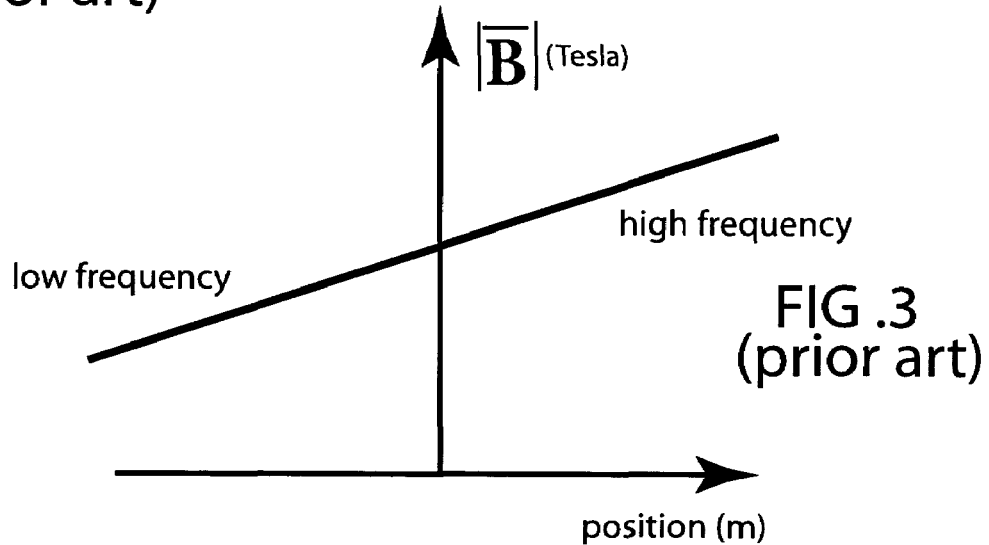
FIG. 3 illustrates frequency encoding using a gradient magnetic field as a function of position, as known in the prior art.
Figure 4:
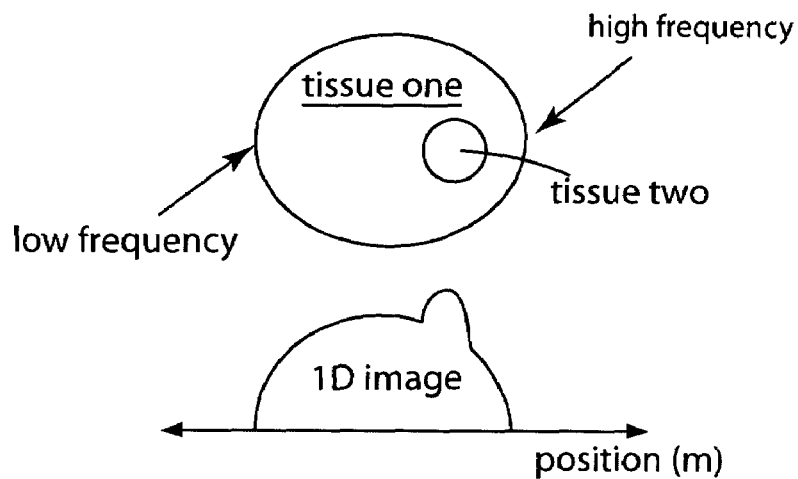
FIG. 4 shows how frequency encoding can provide information about tissue types as a function of position, as known in the prior art.
Figure 5:
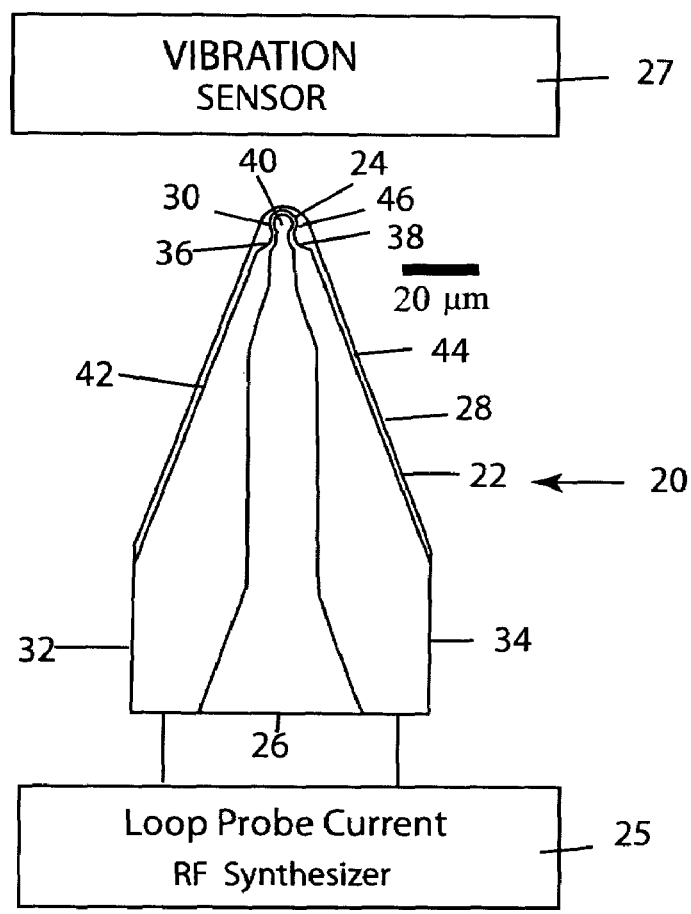
FIG. 5 shows an exemplary magnetic field sensor according to a first aspect of the invention.

Referring to the figures, FIG. 5 shows an exemplary magnetic field sensor, indicated generally at 20, that includes a vibratable member 22 which in the exemplary embodiment of FIG. 5 comprises a cantilever bearing a conductive loop 24, connected to a high frequency signal generator 25. The magnetic field sensor 20 includes a vibration sensor 27 for detecting mechanical vibration of the cantilever 22. The vibration sensor 27 may be, for example, an optical detector such as a laser beam bounced off the cantilever and received by a photodiode, or a piezoelectric or piezoresistive sensor. The mechanical vibration could also be sensed, for example, using electromagnetic techniques.

The cantilever 22 has a mount end 26 that is clamped to a support (not shown), a central portion 28, and a tip portion 30. The conductive loop 24 is preferably located on the tip portion 30 to maximize the motion of the cantilever 22 in response to force applied at the conductive loop 24. However, this is not required and the conductive loop 24 can be located at other positions and still apply force on the cantilever 22, directly or indirectly.

The magnetic field sensor 20 includes an electrical circuit between a first terminal 32 and a second terminal 34. The electrical circuit includes the conductive loop 24, which has a first end 36, a second end 38, and an effective center 40. The first terminal 32 of the sensor 20 is electrically connected to the first end 36 of the conductive loop 24, either directly or by a first lead 42 as shown in FIG. 5. The second terminal 34 of the sensor 20 is electrically connected to the second end 38 of the loop 24, either directly or by a second lead 44. The high frequency signal generator 25 is electrically connected to the first terminal 32 and the second terminal 34.

The loop 24 shown in the sensor 20 of FIG. 5 does not extend an entire turn. In the exemplary magnetic field sensor 20, the active portion 46 of the conductive loop 24 includes approximately ⅘ of a single complete turn between the first end 36 and the second end 38 of the sensor 20. However, this is not required, and a sensor according to the invention may have a loop with an active portion that extends a greater or a lesser number of turns, for example it could consist of a coil having multiple turns.

A coil having multiple turns could be fabricated, for example, using alternating layers of conductive material, such as gold, and insulating material, such as silicon dioxide. In this construction, each layer of conductive material forms a portion of a loop, and these multiple portions of a loop can be connected together at their ends through contact holes in the intervening insulating material to form a coil having multiple turns. Thus, the term "loop" herein includes both structures that are less than an entire turn as well as structures that include one or more turns.

The cantilever 22, preferably formed from silicon, and the conductive loop 24, preferably formed of a non-magnetic metal such as gold, can be made using conventional microfabrication techniques. A suitable process is discussed, for example, in U.S. Pat. No. 5,936,237, the contents of which are hereby incorporated by reference.

The cantilever 22 can be, for example only, approximately 150 microns in length, less than 10 microns in thickness, and triangular in shape. This cantilever construction results in a mechanical structure that behaves much like a triangular-shaped diving board, and will have a mechanical resonant frequency $\omega_{mech}$ determined by the specific dimensions, material, and shape of the cantilever. Cantilevers of lesser or greater length may also be utilized, depending on, e.g., the desired resonant frequency. The vibratable member may also comprise a doubly clamped beam, a membrane, etc., although a singly clamped cantilever beam is preferred.

It is not necessary that the cantilever 22 is formed of silicon. Other materials having suitable properties could be used, such as glass or plastic. A suitable material should be electrically insulating, capable of elastic flexing so that the cantilever can vibrate, it should be formable using microfabrication techniques, and it should have a suitable density, for example. Such other materials can be used instead of or in addition to silicon, for example in a composite laminate or other composite structure.

Also, the triangular shape is not required, and the cantilever could be other shapes, such as rectangular. The cantilever could have different dimensions. Similarly, as noted the vibratable member may be formed to have two anchor ends connected by a free midsection which is able to vibrate like a string. An alternative mechanically resonant structure, such as a membrane, could be used.

The exemplary magnetic field sensor 20 includes a conductive loop 24 having a diameter of approximately 6 microns, although a greater or lesser diameter could be used. The conductive loop 24 and other electrically conductive structures can be formed, for example, of gold, but other conductors, for example a superconductor such as $MgB_2$ or Nb or a non-magnetic conductor such as aluminum, may be used.

The conductive loop 24 is preferably mounted directly on the tip end 30 of a single-anchor cantilever, as shown in FIG. 5, on the midpoint of a double-anchor cantilever or a suspended membrane (not shown), since force exerted on the loop at those positions will have maximum leverage to move the cantilever. However, this is not required and the loop could be mechanically coupled to move the cantilever in other ways, for example through a lever.

Figure 6:
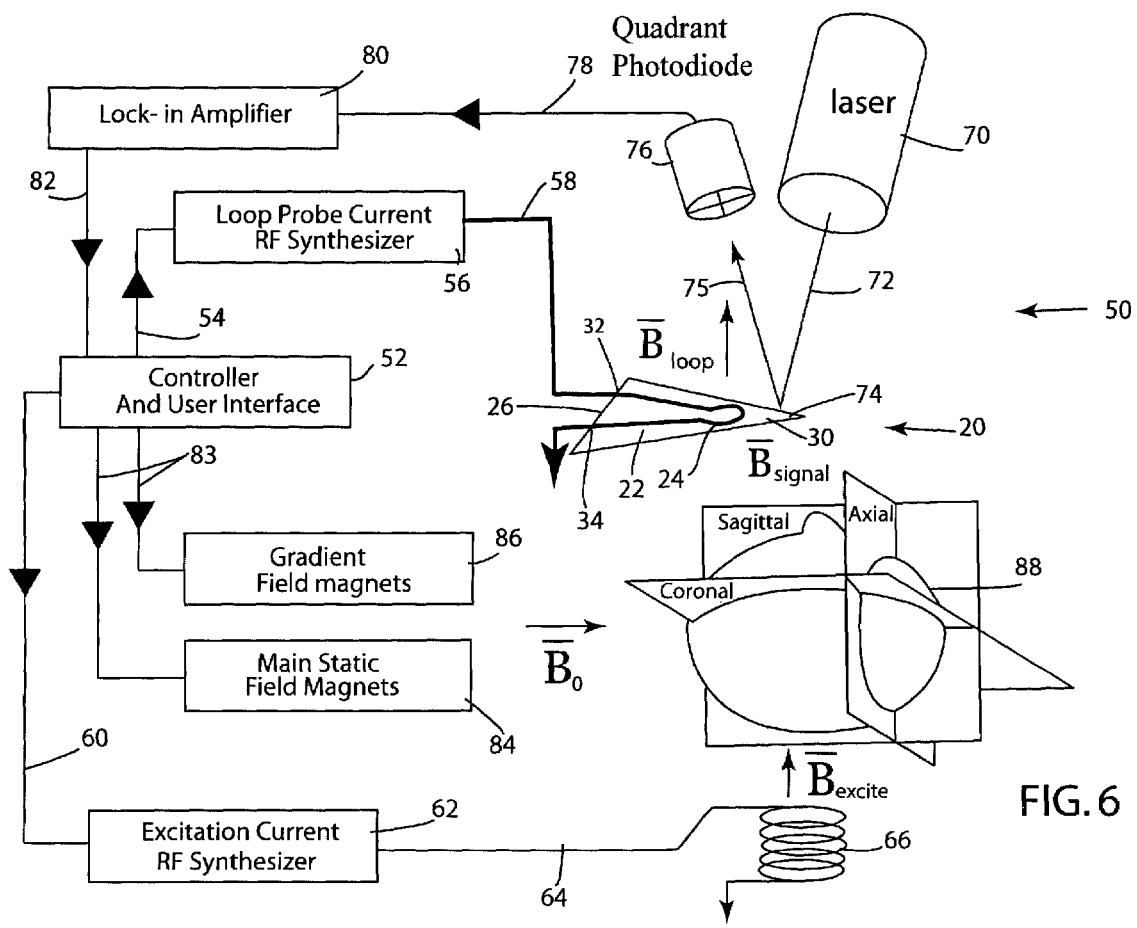
FIG. 6 shows an exemplary MRI device according to another aspect of the invention.

FIG. 6 shows an exemplary MRI system, indicated generally at 50, that includes a magnetic field sensor 20 according to the invention. The MRI system 50 of FIG. 6 is a simplified view of an MRI system according to the invention, able to detect the MRI signal from positions at a particular static magnetic field strength.

The sensor 20, as discussed above, includes a cantilever 22 extending from a mount end 26 to a tip end 30 bearing a conductive loop 24. The conductive loop 24 is part of an electrical circuit between a first terminal 32 and a second terminal 34. The sensor 20 provides simultaneous detection and heterodyning of the MRI signal, as explained in more detail below. The exemplary MRI system 50 preferably includes a controller 52, for example a computer based control system of a type known in the art as being suitable for controlling an MRI system.

The controller 50 provides one or more measurement RF control signals on control lines 54 to a measurement RF synthesizer 56 able to provide a suitable amount of RF power across the range of Larmor frequencies that are expected given the magnitude of the static magnetic field $B_0$ and the NMR-active nuclei used in the MRI system. For example, if the NMR-active species is the $^1$H nucleus in a 2T static magnetic field, then the measurement RF synthesizer must be able to provide an RF signal at approximately 85.16 MHz.

The measurement RF control signals may include, for example, the magnitude, phase, and frequency of the RF power produced by the measurement RF synthesizer 56. The RF power produced by the measurement RF synthesizer 56 is delivered to the sensor 20, for example by electrically connecting the measurement RF synthesizer 56 to the first terminal 32 of the sensor 20 through a transmission line 58.

Other portions of the exemplary MRI system 50 can be of conventional construction, using techniques which are known in the art. The MRI system can include an excitation RF synthesizer 62 to provide RF power at the Larmor frequency to excite the MRI-active nuclei.

The controller 50 can provide one or more excitation RF control signals on control lines 60 to the excitation RF synthesizer 62, for example to control the magnitude, phase, and frequency of the RF power produced by the excitation RF synthesizer 56. The RF power produced by the excitation RF synthesizer 56 can be delivered through a transmission line 64 to an excitation coil 66, where it is transmitted into the body to be imaged 88. Note that, because the frequency of the drive power is so far from the resonant frequency of the cantilever beam, there is substantially no effect on the vibration of the beam due to the interactions between the static magnetic fields from the MRI magnets and the current flowing in the loop on the cantilever beam.

The vibration of the cantilever 22 of the sensor 20 is preferably detected using conventional laser techniques, although this is not required and other methods can be used. For example, a laser source 70 can be used to produce a laser beam 72, which can be bounced off a reflective surface 74 located on the tip 30 of the cantilever 22. The reflected laser beam 75 can be received by a quadrant photodetector 76 to produce a raw vibration signal.

This optical method is not the only method for vibration detection that may be utilized. Any method of vibration detection can be used. For instance, piezoelectric elements can be used, alternatively, for the detection of this mechanical motion, by their induced voltages or currents. Use of piezoelectric elements may result in a more compact sensor. Furthermore, the drive signal from the source 56 may be coupled to the loop conductor 24 in other ways than by direct electrical connection. For example, the power signal may be coupled in via radio waves or by a light signal projected onto a photodiode that is connected to provide power to the loop.

The raw vibration signal from the photodetector can be delivered on a raw vibration signal line 78 to a vibration signal amp 80. The vibration signal amp 80 can be, for example, a narrow band lock-in amplifier that conditions the raw vibration signal by amplifying and bandpass filtering the raw vibration signal to produce a conditioned vibration signal. The center frequency of the bandpass filter would ordinarily be chosen to match the mechanical resonant frequency $\omega_{mech}$ of the cantilever. The conditioned vibration signal can be delivered on a line 82 to the controller 52.

The exemplary MRI system 50 can include field magnets of conventional construction. For example, the MRI system 50 may include one or more static field magnets 84 and one or more gradient magnets 86 of conventional construction that are controlled by the controller 52 using control signals provided on one or more magnet control lines 83.

The following discussion is intended to describe the principles of operation of a sensor according to the invention. However, this description is by way of explanation and not as a limitation.

An external magnetic field being sensed $\overline{B}_{signal}$ is an aggregate of the fields produced by all the contributing magnetic dipole moments $\overline{m}_i$, according [Eq. 4] below. In [Eq. 4], the units of $\overline{B}_{signal}$ are Newtons/amp-meter and the units of $\mu_0$ (the permeability of free space) are Henrys/meter or equivalently volt-seconds/amp-meter, and the units of the aggregate magnetization $\overline{M}_{signal}$ are amps/meter.

$$\overline{B}_{signal} = \mu_0 \overline{M}_{signal} = \mu_0 \lim_{\Delta v \to 0} \frac{1}{\Delta v} \cdot \sum_{i=1}^{N} \overline{m}_i \qquad [\text{Eq. 4}]$$

As shown in [Eq. 4], the aggregate magnetization $\overline{M}_{signal}$ is the sum of all the contributing magnetic dipole moments $\overline{m}_i$ divided by the volume that they occupy, defined as the volume approaches zero volume according to [Eq. 5].

By driving an alternating current $I_{loop}$ at a frequency $\omega_{loop}$ through the loop, an alternating magnetic field $\overline{B}_{loop}$ can be created in the loop at the frequency $\omega_{loop}$. If the loop is planar, the direction of the alternating magnetic field vector $\overline{B}_{loop}$ is normal to the plane of the loop, and spatially localized about the center of the loop, with its maximum value at the center of the loop. The magnitude of the alternating magnetic field vector $\overline{B}_{loop}$ can be calculated using [Eq. 5] below:

$$|\overline{B}_{loop}| = \frac{\mu_0 I_{loop} \cdot R^2}{2 \cdot (x^2 + R^2)^{\frac{3}{2}}} \qquad [\text{Eq. 5}]$$

In [Eq. 5], $I_{loop}$ is the current in the loop in amperes, R is the radius of the loop in meters, and x is the distance of separation along a line normal to the loop between the location where $\overline{B}_{loop}$ is calculated and the center of the loop. It can be seen that in the far-field of the loop, the quantity x is much larger than R, so the denominator is proportional to x to the 3rd power.

This loop-localized magnetic field $\overline{B}_{loop}$ can be used to sense the external magnetic field $\overline{B}_{signal}$, since the loop-localized magnetic field $\overline{B}_{loop}$ will interact with the aggregate magnetization $\overline{M}_{signal}$ to exert a vector force $\overline{F}$ on the loop (and the tip of the cantilever where the loop is mounted) according to [Eq. 6]:

$$\overline{F} = \nabla(\overline{M}_{signal} \cdot \overline{B}_{loop}) = \nabla((\overline{B}_{signal}/\mu_0) \cdot \overline{B}_{loop}) \qquad [\text{Eq. 6}]$$

As shown by [Eq. 6], the vector force $\overline{F}$ is the dot product of two vectors. Therefore, the magnitude and direction of the vector force $\overline{F}$ depends on the magnitudes and the relative orientation of the loop's magnetic field vector $\overline{B}_{loop}$ and the external magnetic field vector being sensed $\overline{B}_{signal}$. For example, when the loop's magnetic field $\overline{B}_{loop}$ is aligned in the same direction as the external field $\overline{B}_{signal}$, the force on the loop pulls the loop toward the source of the external field. When the loop's magnetic field $\overline{B}_{loop}$ is aligned directly opposite to the external field $\overline{B}_{signal}$, the force on the loop pushes the loop away from the source of the external field. When the direction of the loop's magnetic field $\overline{B}_{loop}$ is orthogonal to the direction of the external field $\overline{B}_{signal}$, the magnitude of the force is zero.

The amplitude of the force of interaction, at the resonant frequency of the cantilever, is set by the magnitude of the smaller quantity, either $\overline{B}_{loop}$ or $\overline{B}_{signal}$ as far as the mixing process is concerned. The magnitude of the force also depends on the distance to the loop center from the magnetized sample. The gradient of [Eq. 6] is readily calculated, and this gradient will falloff as x to the 4th power in the far-field (much further away than the radius of the loop, x>>R).

Either a static or a time-varying current can be used to drive the loop, so that the loop's magnetic field $\overline{B}_{loop}$ can be either static or time-varying. Similarly, the external magnetic field $\overline{B}_{signal}$ being sensed can also include both static and time-varying components.

Although the vector force F on the loop according to [Eq. 5] depends only on the loop's magnetic field vector $\overline{B}_{loop}$ and the external magnetic field vector being sensed $\overline{B}_{signal}$, the exact motion of the cantilever in response to that vector force depends on additional factors.

For example, the exact motion of the cantilever depends on the mechanical characteristics of the cantilever, such as its resonant frequency $\omega_{mech}$ which in turn depends on the materials, dimensions, and other design parameters of the cantilever itself. The exact motion of the cantilever also depends, for example, on the location where the vector force is applied on the cantilever, in other words on the location of the loop on the cantilever. Of course, the cantilever's motion also depends on the magnitude, orientation, and frequency content of the loop's magnetic field $\overline{B}_{loop}$ and the magnitude, orientation, and frequency content of the external magnetic field $\overline{B}_{signal}$ being sensed, according to [Eq. 6].

An important phenomenon occurs when the loop's magnetic field $\overline{B}_{loop}$ and the external field being sensed $\overline{B}_{signal}$ are both alternating (AC) fields having high frequency sinusoidal components $\omega_{loop}$ and $\omega_{signal}$ respectively. The loop's magnetic field $\overline{B}_{loop}$ and the external field being sensed $\overline{B}_{signal}$ interact by multiplying (mixing) as they produce force on the cantilever.

Because this multiplying interaction is non-linear, if the loop's alternating magnetic field is at a first frequency $\omega_{loop}$, and the external field is at a second frequency $\omega_{signal}$, the mixing operation produces a mechanical force on the loop having sinusoidal components at both $|\omega_{signal}+\omega_{loop}|$ (the sum frequency) and $\omega_{signal}-\omega_{loop}|$ (the difference frequency). In practice, the components at the difference frequency $|\omega_{signal}-\omega_{loop}|$ are most useful since that difference frequency can be chosen to be a relatively low frequency compared to the relatively high frequencies $\omega_{signal}$ and $\omega_{loop}$.

If the difference frequency is specifically chosen to match the mechanical resonant frequency $\omega_{mech}$ of the cantilever, in other words if $|\omega_{signal}-\omega_{loop}|=\omega_{mech}$, the cantilever acts as an extremely narrow bandpass filter centered at that mechanical resonant frequency $\omega_{mech}$. As previously discussed, the signal frequency $\omega_{signal}$ in an MRI system is generally determined by the magnitude of the static field strength and the NMR-active species used. The mechanical resonant frequency $\omega_{mech}$ is generally determined by the mechanical properties of the cantilever, such as its dimensions and the material it is made from.

Because both the signal frequency $\omega_{signal}$ and the mechanical resonant frequency $\omega_{mech}$ are determined by physical parameters of the MRI device, it will often be most convenient to match the difference frequency to the mechanical resonant frequency by controlling $\omega_{loop}$. In other words, if the frequency $\omega_{loop}$ of the current through the loop is chosen to be substantially equal to either $\omega_{signal}+\omega_{mech}$ or $\omega_{signal}-\omega_{mech}$, the difference frequency will be $\omega_{mech}$ and the resulting interaction between $\overline{B}_{loop}$ and $\overline{B}_{signal}$ will produce alternating mechanical force on the cantilever at its mechanical resonant frequency $\omega_{mech}$.

This alternating mechanical force on the cantilever at its mechanical resonant frequency $\omega_{mech}$ causes the cantilever to vibrate at $\omega_{mech}$. When either the sum or the difference frequency of the net alternating magnetic field is equal to the mechanical resonant frequency of the cantilever, the cantilever is driven into mechanical vibration. This mechanical vibration can be detected coherently, i.e. in-phase with the frequency difference or sum, between the loop drive and the alternating field of the sample.

Thus, the cantilever acts as a narrow-band filtered heterodyne receiver for the external field $\overline{B}_{signal}$. The cantilever heterodynes the high frequency magnetic field $\overline{B}_{signal}$ at frequency $\omega_{sample}$ down to the lower frequency $\omega_{mech}$ vibration of the cantilever, and the magnitude of the vibration of the cantilever corresponds to the magnitude of the high frequency magnetic field $\overline{B}_{signal}$ being measured.

The mechanical vibration of the cantilever is a result of the net magnetic force that is localized on the cantilever at the position of the loop. This force localization is important, and can be described from both the mechanical and the electromagnetic perspectives.

First, from a completely mechanical perspective, it is well known that the effectiveness of forces to cause mechanical vibration is enhanced as the force is applied closer to the end of a mechanical cantilever. This suggests that the detection of magnetic fields is localized to an area that is smaller than the surface of the cantilever, and is localized to some area at the very end of the cantilever, which is only a few microns-square in area.

Second, from an electromagnetic point of view, the mechanical force arises from the field in the loop, which exists within the loop, and is no bigger than the loop itself. So, both electromagnetically and mechanically, the external magnetic field is being sensed in an area that is only about the size of the loop, which is six microns in diameter, and which can be scaled down further with improvements in lithography.

Figure 7:
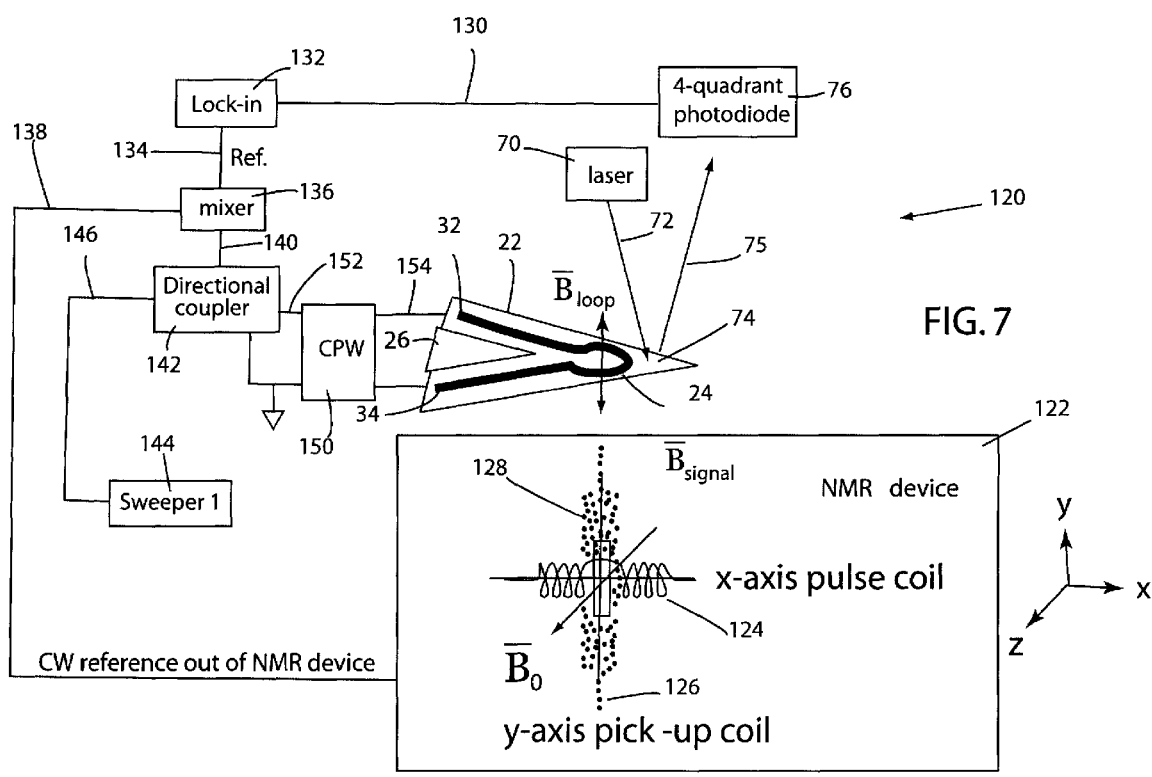
FIG. 7 shows an NMR system including a magnetic field sensor according to the invention.

FIG. 7 shows a configuration for an alternative magnetic field sensor, indicated generally at 120, according to an aspect of the invention for an NMR system, indicated generally at 122.

The exemplary NMR device 122 includes an x-axis pulse coil 124 for exciting NMR resonance, and a y-axis pickup coil 126. A suitable material for NMR analysis, for example a mineral oil bath 128, is subjected to RF energy to cause NMR resonance that can be detected by the magnetic field sensor 120.

The magnetic field sensor 120 includes a cantilever 22 having a conductive loop 24. The cantilever 22 has a mount end 26 bearing a first terminal 32 and a second terminal 34 which are electrically connected to the ends of the conductive loop 24.

The magnetic field sensor includes a vibration sensor, for example a laser source 70 that provides a laser beam 72 which can be bounced off a reflective surface 74 to produce a reflected laser beam 75 that can be received by a photodetector 76 to produce a raw vibration signal on a raw vibration signal line 130. The raw vibration signal on the raw vibration signal line 130 can be conditioned and amplified, for example by a lock in amplifier 132, to produce a conditioned vibration signal on a conditioned vibration signal line 134.

The conditioned vibration signal on the conditioned vibration signal line 134 can be supplied to one input of a mixer 136 and mixed with a CW reference signal on a CW reference line 138 that is supplied to a second input of the mixer 136. The mixer 136 mixes the conditioned vibration signal and the CW reference signal to produce a mixer output signal on a mixer output line 140.

The mixer output signal on the mixer output line can be supplied to a first input of a directional coupler 142. A first sweeper 144 can provide a first sweeper output signal on a first sweeper output line 148 to a second input of the directional coupler 142. The directional coupler can provide an output signal to a CPW 150 on a CPW input line 152. The output of the CPW can be provided on a CPW output line 154 to the first terminal 32 of the cantilever 22.

Figure 8:
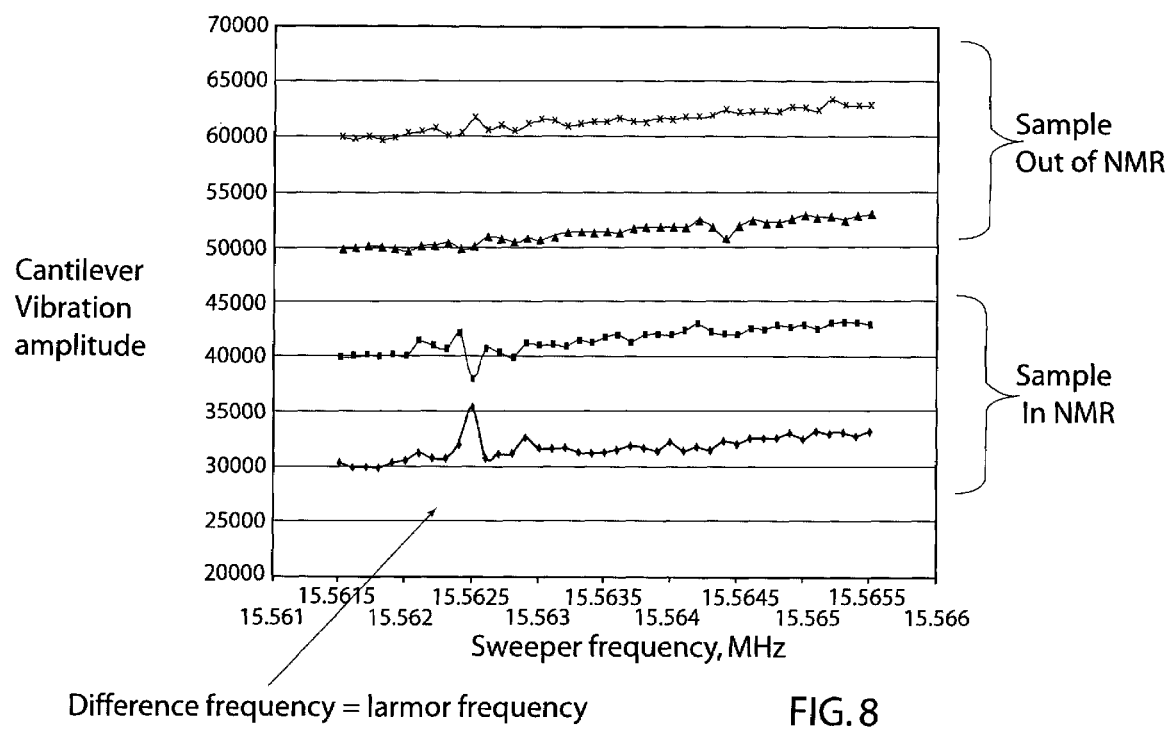
FIG. 8 shows how the amplitude of cantilever vibration varies as a function of sweeper frequency, with a sample both in and out of NMR, in the system of FIG. 7.

FIG. 8 shows the variation of the amplitude of cantilever vibration as a function of sweeper frequency, with a sample both in and out of NMR, in the system of FIG. 7.

Figure 9:
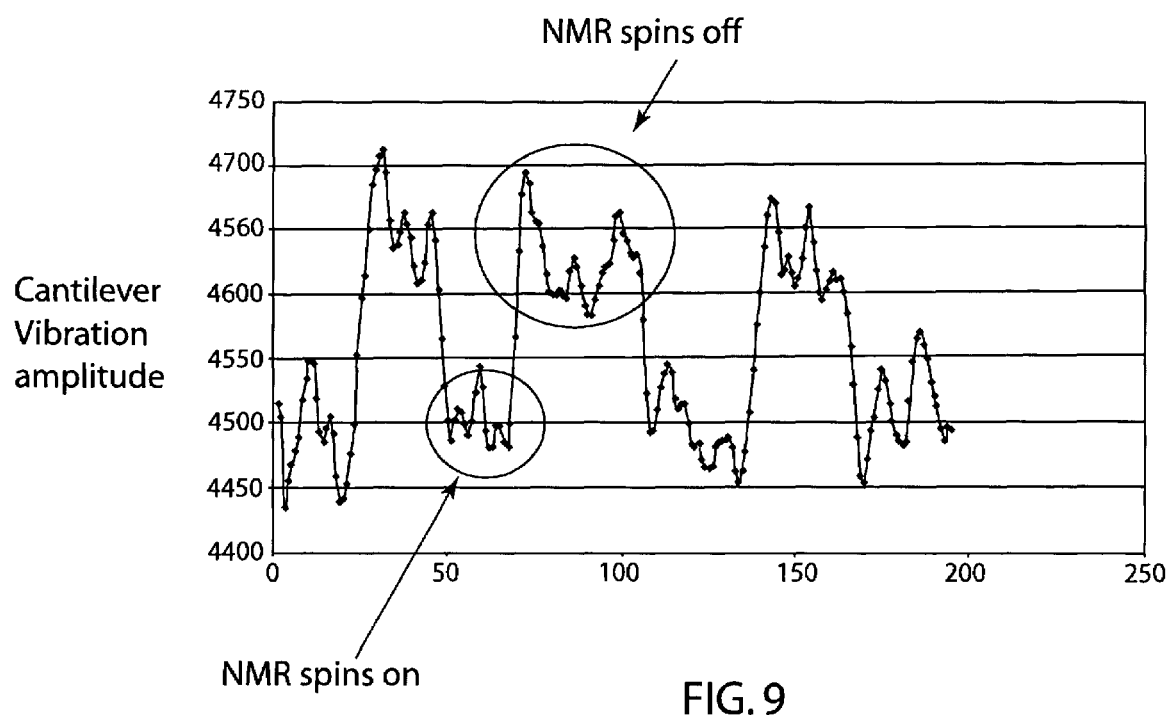
FIG. 9 shows how the amplitude of cantilever vibration varies as a function of time, in the system of FIG. 7.

FIG. 9 shows the variation of the amplitude of cantilever vibration as a function of signal frequency and the difference between signal frequency and coil drive frequency, in the system of FIG. 7.

Figure 10:
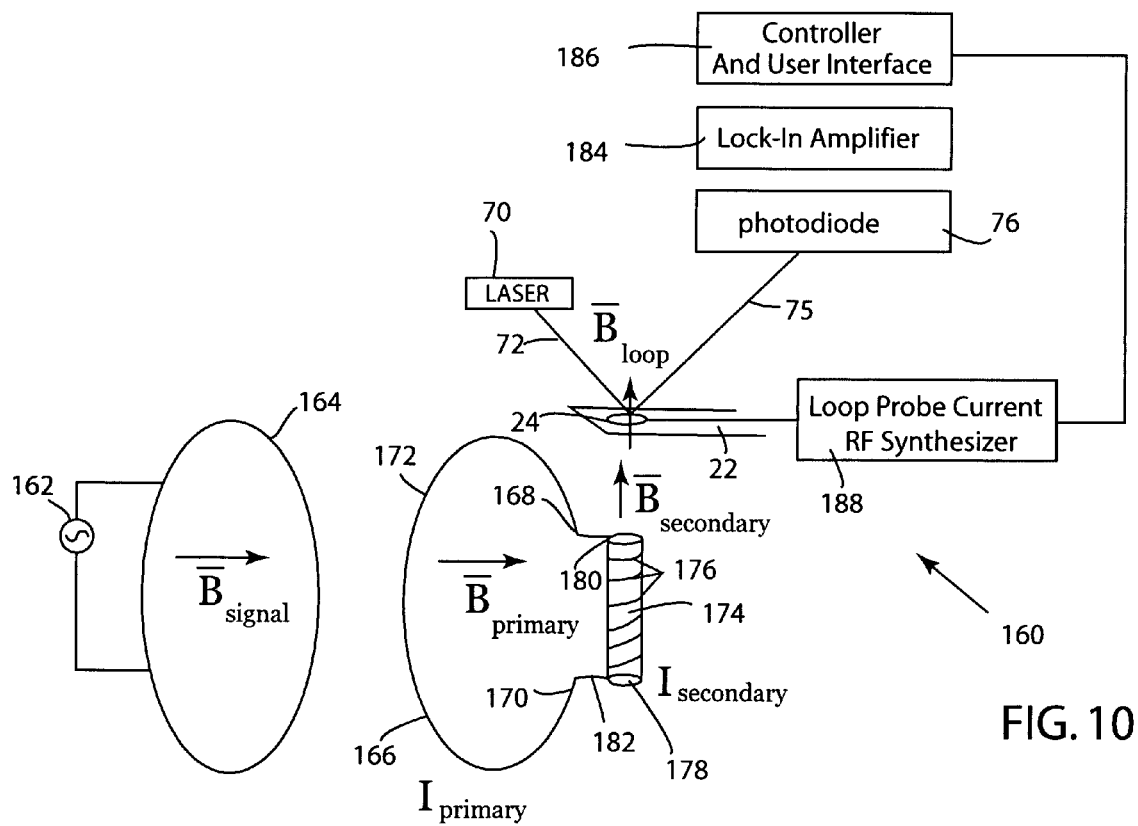
FIG. 10 shows a magnetic field sensor according to another embodiment of the invention.

FIG. 10 shows a magnetic field sensor according to another embodiment of the invention, indicated generally at 160. In FIG. 10, the source of the external magnetic field being sensed $\overline{B}_{signal}$ is modeled as an AC signal generator 162 that drives an AC current at frequency $\omega_{signal}$ through a signal transmission coil 164. This arrangement can be used for test purposes to test the functioning of the sensor 160.

The magnetic field sensor 160 includes a primary signal reception coil 166 having a relatively large radius $r_{primary}$, for example, about 50 mm, to improve far field detection. The primary signal reception coil 166 can be formed, for example, of one or more turns of wire arranged to lie approximately in a plane. The primary signal reception coil 166 has a first end 168, a second end 170, and an active portion 172 between the first end 169 and the second end 170.

The magnetic field sensor 160 also includes a secondary signal reception coil 174 having a relatively small radius $r_{secondary}$, for example, about 0.4 mm. The secondary reception coil 174 can be formed, for example, by winding a plurality of turns of wire 176 about a core 178. The secondary signal reception coil 174 has a first end 180 electrically connected to the first end 168 of the primary signal reception coil 166, and a second end 182 electrically connected to the second end 170 of the primary signal reception coil 166.

The primary and secondary signal reception coils are preferably constructed and arranged to avoid capacitance, to ensure the inductive loop has wideband response. The primary signal reception coil 166 and the secondary signal reception coil 174 are preferably oriented orthogonal to each other. This orientation results in negligible mutual coupling between the two coils, giving undistorted fields.

The vibration or other motion of the cantilever can be measured, for example, using a laser source 70 that bounces a laser beam 72 off a reflective portion of the cantilever 22. The reflected laser beam 75 can be collected by a photodetector 76. The resulting signal can be amplified and conditioned, for example by a lock-in amplifier 184 that acts as a narrow band filter, although this is not required. The conditioned and amplified signal can be provided to a controller and user interface 186. However, this is not required and other methods for measuring the vibration or other motion of the cantilever can be used.

The following discussion is intended to describe the principles of operation of the sensor 160 according to the invention. However, this description is by way of explanation and not as a limitation.

The external magnetic field being sensed $\overline{B}_{signal}$ at frequency $\omega_{signal}$ will induce a current $I_{primary}$ in the primary signal reception coil 166 at that same frequency $\omega_{signal}$ according to [Eq. 7]:

$$\oint \overline{B}_{primary} \cdot dl = \mu I_{primary} \qquad [\text{Eq. 7}]$$

Working like a transformer, the same current flows through both the coils. In other words, the current $I_{primary}$ induced in the primary coil 166 also flows as current $I_{secondary}$ through the secondary coil 174, and $I_{primary} = I_{secondary}$. The current $I_{secondary}$ flowing through the secondary signal reception coil 174 produces an alternating magnetic field $\overline{B}_{secondary}$ at that same frequency $\omega_{signal}$ and oriented along the longitudinal axis of the secondary coil 174 according to [Eq. 8]:

$$\oint \overline{B}_{secondary} \cdot dl = \mu I_{secondary} \qquad [\text{Eq. 8}]$$

The radius $r_{primary}$ of the primary signal reception coil 166 is larger than the radius of the secondary signal reception coil 174 $r_{secondary}$, yet the same current flows through the two coils. Consequently, the magnitude of the alternating magnetic field $\overline{B}_{secondary}$ from the secondary coil 174 is greater than the magnitude of the alternating magnetic field $\overline{B}_{primary}$ of the primary coil, according to the relationship of [Eq. 9]:

$$|\overline{B}_{secondary}| = |\overline{B}_{primary}| \times \frac{r_{primary}}{r_{secondary}} \qquad [\text{Eq. 9}]$$

For example, if the radius of the primary coil 166 is chosen to be 100 times greater than the radius of the secondary coil 174, the magnitude of the alternating magnetic field $\overline{B}_{secondary}$ out of the secondary coil is 100 times greater than the magnitude of the alternating magnetic field $\overline{B}_{primary}$ into the primary coil.

The magnetic field sensor 160 includes a cantilever 22 bearing a conductive loop 24, preferably mounted on the tip of the cantilever. The conductive loop 24 is preferably planar, and positioned adjacent to the secondary coil 174, with the plane of the conductive loop 24 normal to the longitudinal axis of the secondary coil 174 and with the center of the conductive loop 24 aligned with the longitudinal axis of the secondary coil 174. This arrangement is preferred to maximize the portion of the alternating magnetic field $\overline{B}_{secondary}$ produced by the secondary coil 174 that passes through the conductive loop 24.

By driving an alternating current $I_{loop}$ at a frequency $\omega_{loop}$ through the loop 24, an alternating magnetic field $\overline{B}_{loop}$ centered in the loop can be created at the frequency $\omega_{loop}$. Such an alternating current $I_{loop}$ at a frequency $\omega_{loop}$ can be provided, for example, by a RF synthesizer 188. The loop-localized magnetic field $\overline{B}_{loop}$ will interact with the magnetic field $\overline{B}_{secondary}$ produced by currents induced in the secondary signal reception coil 174 to exert a vector force $\overline{F}$ on the loop (and the tip of the cantilever where the loop is mounted) according to [Eq. 6]:

$$\overline{F} = \frac{\nabla(\overline{B}_{loop} \cdot \overline{B}_{secondary})}{\mu_0} \qquad \text{[Eq. 6]}$$

The vector force $\overline{F}$ on the loop will cause the cantilever 22, to move in some fashion. The dipole—dipole force between $\overline{B}_{loop}$ and $\overline{B}_{secondary}$, being the dot product of the magnetic moment on the cantilever coil and the spatial gradient of the sample's magnetic field, results in a modulated force at the sum and difference of frequencies of the sample's response and the current on the cantilever.

Importantly, if the cantilever 22 has a mechanical resonant frequency $\omega_{mech}$ and the signal and loop frequencies are chosen such that $|\omega_{signal}-\omega_{loop}|=\omega_{mech}$, the cantilever will vibrate at its mechanical resonant frequency $\omega_{mech}$ thereby acting as a very high 'Q' bandpass filter. The signal and loop frequencies can be chosen such that $|\omega_{signal}-\omega_{loop}|=\omega_{mech}$ with an appropriate choice of $\omega_{loop}$ (the frequency of the current on the loop).

The vector force on the loop 24 as a function of time and displacement from the center of the loop can be determined according to [Eq.7(a)]–[Eq. 7(c)]:

$$\overline{F}(z,t) = \frac{\overline{B}_{loop}}{\mu} \cdot \cos(\omega_{loop}t)\nabla\left(\sum \overline{B}_{secondary}(z)\sin(\omega_{signal}t)\right) \qquad \text{[Eq. 7(a)]}$$

$$\overline{F}(z,t) = \frac{\overline{B}_{loop}}{\mu} \cdot \cos(\omega_{loop}t)\frac{d}{dt}\left(\sum \overline{B}_{secondary}(z)\sin(\omega_{signal}t)\right)\frac{dt}{dz} \qquad \text{[Eq. 7(b)]}$$

$$\overline{F}(z,t) = \frac{\overline{B}_{loop}}{\mu} \cdot \frac{d}{dt}\left(\sum \frac{\omega_{signal}}{2}\overline{B}_{secondary}(z)\cos(\omega_{signal}t-\omega_{loop}t)\cos(\omega_{signal}t+\omega_{loop}t)\right)\frac{dt}{dz} \qquad \text{[Eq. 7(c)]}$$

The core 178 of the secondary coil 174 is preferably formed of a ceramic material that is lightweight and temperature stable. By choosing a core material that has a high dielectric constant, the disparity in the dielectric constant at the interface between the core and the surrounding air causes internal reflection which tends to confine the magnetic fields in the core, thereby creating a resonant structure able to store energy.

The core is preferably dimensioned to have a height to radius ratio less than 2.03, whereby $TE_{01}$ mode is the dominant mode for resonance in the coil. The attenuation coefficient for this mode decreases monotonically with increasing frequency, which is a highly desirable characteristic for high frequency operation. The force acting on the cantilever is equal to its magnetic moment times the spatial gradient of the magnetic field from the sample, which, in our case, is the time gradient multiplied by the reciprocal of the velocity of propagation of the force in the medium. Thus, the force increases by the square root of permittivity of the core material, according to [Eq. 8], whereby the magnitude of the force can be increased by choosing a core material with a large dielectric constant $\in_{diel}$.

$$\overline{F} = \frac{B_{loop}}{\mu_0}\frac{d}{dt}\overline{B}_{secondary}(z)\sqrt{\mu\varepsilon}_{diel} \qquad \text{[Eq. 9]}$$

Figure 11:
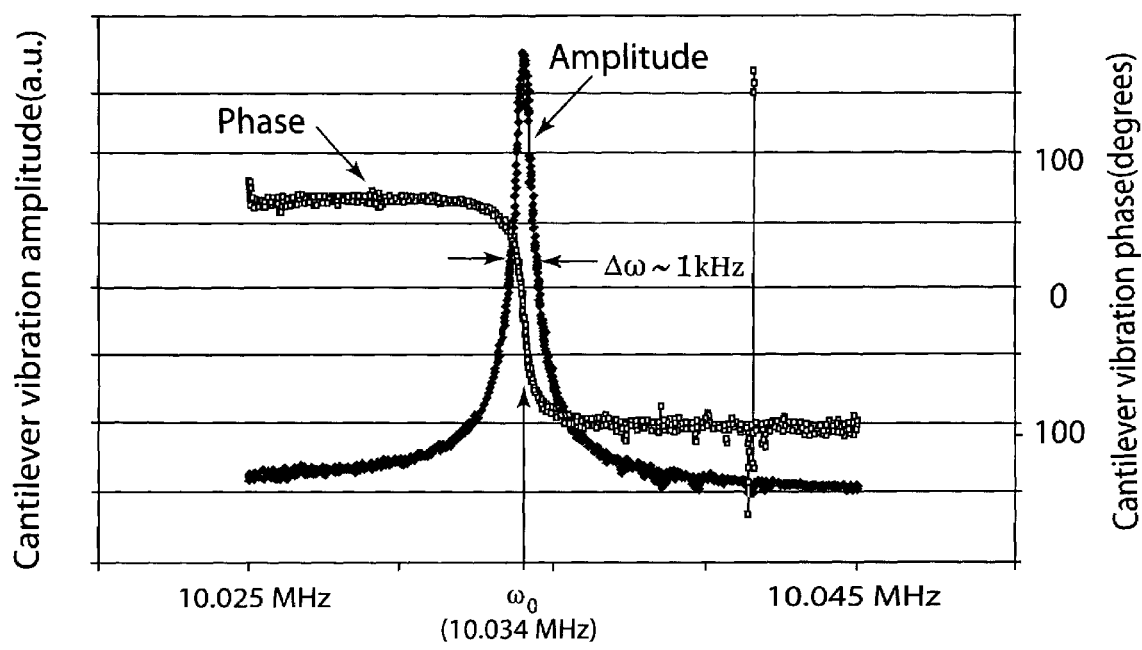
FIG. 11 shows graphs of amplitude and phase for an exemplary magnetic field sensor system in accordance with the invention.

FIG. 11 shows the resonance amplitude and phase of a cantilever that is being excited by a test dipole and an intermediate coil as in FIG. 10. The frequency axis is GHz. The test dipole 164 is excited by a 10 MHz signal, making the LO frequency 10 MHz. The loop probe cantilever is driven with a signal at 10.034 MHz, for a difference frequency, between the signal on the loop probe cantilever and the signal on the primary coil, of 34 KHz. The mechanical response of the cantilever is about 1 KHz wide, indicating a mechanical Q of approximately (34 KHz/1 KHz)=34. However, the electrical Q may be represented as (10 MHz/34 KHz)=294. As we increase the LO frequency, the mechanical Q remains the same, but the electrical Q increases. The narrow frequency response of the mechanical oscillator is seen to be particularly useful for demodulation of signals that are closely spaced in frequency. The graph of FIG. 11 looks qualitatively the same when it is performed at, e.g., 10 MHz, 20 MHz, or 2 GHz.

It is important to note that the construction and arrangement of the elements of the magnetic field sensor and other structures shown in the exemplary embodiments discussed herein are illustrative only. Those skilled in the art who review this disclosure will readily appreciate that many modifications are possible (e.g., variations in sizes, dimensions, structures, shapes and proportions of the various elements, values of parameters, mounting arrangements, materials, transparency, color, orientation, etc.) without materially departing from the novel teachings and advantages of the invention.

Further, while the exemplary application of the device is in the field of magnetic resonance imaging, the invention has a much wider applicability.

The particular materials used to construct the exemplary embodiments are also illustrative. For example, although the cantilever in the exemplary embodiment is preferably made of silicon, other materials having suitable properties could be used. All such modifications, to materials or otherwise, are intended to be included within the scope of the present invention as defined in the appended claims.

The order or sequence of any process or method steps may be varied or re-sequenced according to alternative embodiments. Other substitutions, modifications, changes and/or omissions may be made in the design, operating conditions and arrangement of the preferred and other exemplary embodiments without departing from the spirit of the present invention as expressed in the appended claims.

The components of the invention may be mounted to each other in a variety of ways as known to those skilled in the art. As used in this disclosure and in the claims, the terms mount and attach include embed, glue, join, unite, connect, associate, hang, hold, affix, fasten, bind, paste, secure, bolt, screw, rivet, solder, weld, and other like terms. The term cover includes envelop, overlay, and other like terms.

It is understood that the invention is not confined to the embodiments set forth herein as illustrative, but embraces all such forms thereof that come within the scope of the following claims.

What is claimed is:

1. A method or device for detecting the magnitude of an alternating magnetic field B_signal at a frequency ω_signal, comprising:
   (a) providing a conductive loop on a vibratable member, wherein the vibratable member has a mechanical resonant frequency ω_mech;
   (b) driving an alternating current at a frequency ω_loop through the loop, wherein ω_loop≈ω_signal+ω_mech or ω_loop≈ω_signal−ω_mech, thereby creating an alternating magnetic field B_loop in the loop at the frequency ω_loop which interacts with the alternating magnetic field B_signal to exert alternating mechanical force at frequency ω_mech on the loop and vibratable member;
   (c) detecting a magnitude of vibration of the vibratable member at the mechanical resonant frequency ω_mech and providing an output signal reflecting the magnitude of the vibration of the vibratable member;
   whereby the magnitude of the alternating magnetic field B_signal at the frequency ω_signal is reflected in the magnitude of vibration of the vibratable member at frequency ω_mech.

2. The method of claim 1, wherein the vibratable member comprises a cantilever beam having a first end clamped to a support and a second free end.

3. The method of claim 2, wherein $\omega_{mech}$ is between 10 kHz and 1 MHz.

4. The method of claim 2 wherein the distance between the first clamped end of the cantilever and the second free end is between 10 microns and 1000 microns.

5. The method of claim 2 wherein the free end of the cantilever has a reflective portion, and wherein step (c) is performed by reflecting a laser beam off the reflective portion of the cantilever to a photodetector producing an output signal that reflects the magnitude of the vibration of the cantilever.

6. The method of claim 5 wherein the conductive loop is positioned on the cantilever between the reflective portion and the first end of the cantilever.

7. The method of claim 2 wherein $\omega_{loop}$ is between 10 MHz and 1 GHz.

8. The method of claim 1 adapted for nuclear magnetic resonance (NMR) analysis of an object containing NMR-active nuclei and further comprising the steps of:
   (d) subjecting the object to a static magnetic field $B_0$ whereby at least a portion of the NMR-active nuclei in the object are aligned with the static magnetic field; and
   (e) subjecting the object to a burst of radio frequency (RF) energy at a frequency $\omega_{signal}$ to excite at least a portion of the NMR-active nuclei into an excited state, wherein frequency $\omega_{signal}$ is the Larmor frequency of the NMR-active nuclei in the static magnetic field $B_0$;
   whereby the NMR-active nuclei in the excited state emit the alternating magnetic field $B_{signal}$ at frequency $\omega_{signal}$ as they return to their pre-excitation state.

9. The method of claim 8 adapted for magnetic resonance imaging (MRI) imaging of the object in one dimension x, and further comprising the steps of:
   (f) subjecting the object to a gradient magnetic field B(x) whereby the Larmor frequencies of the NMR-active nuclei in the object fall within a range Larmor frequencies; and
   (g) repeating steps (d) and (e) at different frequencies $\omega_{signal}$ within the range of Larmor frequencies in the object;
   whereby during each repetition of steps (d)–(e) the RF energy excites only those NMR-active nuclei having a Larmor frequency which coincides with the frequency of the RF energy.

10. A device for detecting the magnitude of an alternating magnetic field $B_{signal}$ at a frequency $\omega_{signal}$, comprising:
    (a) a conductive loop on a vibratable member, wherein the conductive loop has a first terminal and a second terminal, and wherein the vibratable member has a mechanical resonant frequency $\omega_{mech}$
    (b) a source providing an alternating current at frequency $\omega_{loop}$ wherein $\omega_{loop}\approx\omega_{signal}+\omega_{mech}$ or $\omega_{loop}\approx\omega_{signal}-\omega_{mech}$, wherein the source has a first terminal electrically connected to the first terminal of the conductive loop and a second terminal electrically connected to the second terminal of the conductive loop, whereby the alternating current passes through the conductive loop and creates an alternating magnetic field $B_{loop}$ in the loop at the frequency $\omega_{loop}$ which interacts with the alternating magnetic field $B_{signal}$ to exert alternating mechanical force at frequency $\omega_{mech}$ on the loop and vibratable member; and
    (c) a vibration sensor for detecting a magnitude of vibration of the vibratable member at the mechanical resonant frequency $\omega_{mech}$ and providing an output signal reflecting the magnitude of the vibration of the vibratable member at frequency $\omega_{mech}$
    whereby the magnitude of the alternating magnetic field $B_{signal}$ at the frequency $\omega_{signal}$ near the conductive loop is reflected in the output signal from the vibration sensor.

11. The device of claim 10, wherein the vibratable member comprises a cantilever beam having a first end clamped to a support and a second free end.

12. The device of claim 11, wherein $\omega_{mech}$ is between 10 kHz and 1 MHz.

13. The device of claim 11 wherein the distance between the first clamped end of the cantilever and the second free end is between 10 microns and 1000 microns.

14. The device of claim 11 wherein the free end of the cantilever has a reflective portion, and further comprising a laser source and a photodetector producing an output signal, wherein the laser source transmits a laser beam onto the reflective portion of the cantilever which reflects the laser beam to the photodetector, whereby the output signal from the photodetector reflects the magnitude of the vibration of the cantilever.

15. The device of claim 14 wherein the conductive loop is positioned on the cantilever between the reflective portion and the first end of the cantilever.

16. The device of claim 11 wherein $\omega_{loop}$ is between 10 MHz and 1 GHz.

17. The device of claim 10 adapted for nuclear magnetic resonance (NMR) analysis of an object containing NMR-active nuclei and further comprising:
    a static field magnet providing a static magnetic field $B_0$ to the object, whereby at least a portion of the NMR-active nuclei in the object are aligned with the static magnetic field; and
    an excitation radio frequency (RF) power source electrically coupled to an excitation coil that subjects the object to a burst of RF energy at a frequency $\omega_{signal}$ to excite at least a portion of the NMR-active nuclei into an excited state, wherein frequency $\omega_{signal}$ is the Larmor frequency of the NMR-active nuclei in the static magnetic field $B_0$;

whereby the NMR-active nuclei in the excited state emit the alternating magnetic field $B_{signal}$ at frequency $\omega_{signal}$ as they return to their pre-excitation state.

18. The device of claim 17 adapted for magnetic resonance imaging (MRI) imaging of the object in one dimension x, and further comprising:

a gradient field magnet providing a gradient magnetic field B(x) to the object whereby the Larmor frequencies of the NMR-active nuclei in the object fall within a range of Larmor frequencies;

and wherein the excitation RF power source is adapted to provide RF power at a plurality of frequencies with the range of Larmor frequencies.

19. A method for detecting the magnitude of an alternating magnetic field B_signal at a frequency ω_signal, comprising:

(a) providing a primary signal reception coil having a conductor arranged around at least a portion of the periphery of a primary signal reception coil area through which the alternating magnetic field B_signal passes, the conductor extending from a first end to a second end;

(b) providing a secondary signal reception coil having a conductor arranged around a core, the core having a longitudinal axis and an area orthogonal to the longitudinal axis, the conductor extending from a first end to a second end, wherein the first end of the conductor of the secondary signal reception coil is electrically connected to the first end of the primary signal reception coil and wherein the second end of the conductor of the secondary signal reception coil is electrically connected to the second end of the primary signal reception coil;

(c) providing a conductive loop on a vibratable member, wherein the conductive loop is arranged approximately in a plane orthogonal to the longitudinal axis of the core of the secondary signal reception coil, and wherein the vibratable member has a mechanical resonant frequency ω_mech;

(d) driving an alternating current at a frequency ω_loop through the loop, wherein ω_loop≈ω_signal+ω_mech or ω_loop=ω_signal−ω_mech, thereby creating an alternating magnetic field B_loop in the loop at the frequency ω_loop which interacts with the alternating magnetic field B_signal to exert alternating mechanical force at frequency ω_mech on the loop and vibratable member; and (e) detecting a magnitude of vibration of the vibratable member at the mechanical resonant frequency ω_mech and providing an output signal reflecting the magnitude of the vibration of the vibratable member;

whereby the magnitude of the alternating magnetic field B_signal at the frequency ω_signal is reflected in the magnitude of vibration of the vibratable member at frequency ω_mech.

20. The method of claim 19, wherein the vibratable member comprises a cantilever beam having a first end clamped to a support and a second free end.

21. The method of claim 20 wherein the distance between the first clamped end of the cantilever and the second free end is between 10 microns and 1000 microns.

22. The method of claim 20 wherein the free end of the cantilever has a reflective portion, and wherein step (e) is performed by reflecting a laser beam off the reflective portion of the cantilever to a photodetector producing an output signal that reflects the magnitude of the vibration of the cantilever.

23. The method of claim 19, wherein $\omega_{mech}$ is between 10 KHz and 1 MHz.

24. The method of claim 19 wherein $\omega_{loop}$ is between 10 MHz and 1 GHz.

25. The method of claim 19 wherein the conductor of the primary signal reception coil is arranged substantially in a plane parallel to the longitudinal axis of the core of the secondary signal reception coil.

26. The method of claim 19 wherein the area of the primary signal reception coil is at least 100 times greater than the area of the core orthogonal to the longitudinal axis of the core.

27. The method of claim 19 wherein the area of the primary signal reception coil is at least 1000 times greater than the area of the core orthogonal to the longitudinal axis of the core.

28. The method of claim 19 wherein the area of the primary signal reception coil is at least 10000 times greater than the area of the core orthogonal to the longitudinal axis of the core.

29. The method of claim 19 wherein the conductor of the primary signal reception coil extends around the periphery of the primary signal reception coil area by a first number of turns that may be less than one, and wherein the conductor of the secondary signal reception coil extends around the core of the secondary signal reception coil area by a second number of turns that is greater than 1.

30. The method of claim 29 wherein the first number of turns is greater than or equal to one.

31. The method of claim 29 wherein the second number of turns is at least 10 times the first number of turns.

32. The method of claim 29 wherein the second number of turns is at least 1000 times the first number of turns.

33. The method of claim 19 adapted for nuclear magnetic resonance (NMR) analysis of an object containing NMR-active nuclei and further comprising the steps of:

(f) subjecting the object to a static magnetic field $B_0$ whereby at least a portion of the NMR-active nuclei in the object are aligned with the static magnetic field; and (g) subjecting the object to a burst of radio frequency (RF) energy at a frequency $\omega_{signal}$ to excite at least a portion of the NMR-active nuclei into an excited state, wherein frequency $\omega_{signal}$ is the Larmor frequency of the NMR-active nuclei in the static magnetic field $B_0$;

whereby the NMR-active nuclei in the excited state emit the alternating magnetic field $B_{signal}$ at frequency $\omega_{signal}$ as they return to their pre-excitation state.

34. The method of claim 33 adapted for magnetic resonance imaging (MRI) imaging of the object in one dimension x, and further comprising the steps of:

(h) subjecting the object to a gradient magnetic field B(x) whereby the Larmor frequencies of the NMR-active nuclei in the object fall within a range Larmor frequencies; and (i) repeating steps (f) and (g) at different frequencies $\omega_{signal}$ within the range of Larmor frequencies in the object;

whereby during each repetition of steps (f) and (g) the RF energy excites only those NMR-active nuclei having a Larmor frequency which coincides with the frequency of the RF energy.

35. A device for detecting the magnitude of an alternating magnetic field $B_{signal}$ at a frequency $\omega_{signal}$, comprising:
  (a) a primary signal reception coil having a conductor arranged at least a portion of the periphery of a primary signal reception coil area through which the alternating magnetic field $B_{signal}$ passes, the conductor extending from a first end to a second end;
  (b) a secondary signal reception coil having a conductor arranged around a core, the core having a longitudinal axis and an area orthogonal to the longitudinal axis, the conductor extending from a first end to a second end, wherein the first end of the conductor of the secondary signal reception coil is electrically connected to the first end of the primary signal reception coil and wherein the second end of the conductor of the secondary signal reception coil is electrically connected to the second end of the primary signal reception coil;
  (c) a conductive loop on a vibratable member, wherein the conductive loop is arranged approximately in a plane orthogonal to the longitudinal axis of the core of the secondary signal reception coil, wherein the conductive loop has a first terminal and a second terminal, and wherein the vibratable member has a mechanical resonant frequency $\omega_{mech}$
  (d) a source providing an alternating current at frequency $\omega_{loop}$ wherein $\omega_{loop} \approx \omega_{signal} + \omega_{mech}$ or $\omega_{loop} \approx \omega_{signal} - \omega_{mech}$, wherein the source has a first terminal electrically connected to the first terminal of the conductive loop and a second terminal electrically connected to the second terminal of the conductive loop, whereby the alternating current passes through the conductive loop and creates an alternating magnetic field $B_{loop}$ in the loop at the frequency $\omega_{loop}$ which interacts with the alternating magnetic field $B_{signal}$ to exert alternating mechanical force at frequency $\omega_{mech}$ on the loop and vibratable member; and
  (e) a vibration sensor for detecting a magnitude of vibration of the vibratable member at the mechanical resonant frequency $\omega_{mech}$ and providing an output signal reflecting the magnitude of the vibration of the vibratable member at frequency $\omega_{mech}$
  whereby the magnitude of the alternating magnetic field $B_{signal}$ at the frequency $\omega_{signal}$ near the conductive loop is reflected in the output signal from the vibration sensor.

36. The device of claim 35, wherein the vibratable member comprises a cantilever beam having a first end clamped to a support and a second free end.

37. The device of claim 36 wherein the distance between the first clamped end of the cantilever and the second free end is between 10 microns and 1000 microns.

38. The device of claim 36 wherein the free end of the cantilever has a reflective portion, and the vibration sensor comprises a laser reflecting its beam off the reflective portion of the cantilever, and a photodetector detecting the reflected beam to produce an output signal that reflects the magnitude of the vibration of the cantilever.

39. The device of claim 35, wherein $\omega_{mech}$ is between 10 kHz and 1 MHz.

40. The device of claim 35 wherein $\omega_{loop}$ is between 10 MHz and 1 GHz.

41. The device of claim 35 wherein the conductor of the primary signal reception coil is arranged substantially in a plane parallel to the longitudinal axis of the core of the secondary signal reception coil.

42. The device of claim 35 wherein the area of the primary signal reception coil is at least 100 times greater than the area of the core orthogonal to the longitudinal axis of the core.

43. The device of claim 35 wherein the area of the primary signal reception coil is at least 1000 times greater than the area of the core orthogonal to the longitudinal axis of the core.

44. The device of claim 35 wherein the area of the primary signal reception coil is at least 10000 times greater than the area of the core orthogonal to the longitudinal axis of the core.

45. The device of claim 35 wherein the conductor of the primary signal reception coil extends around the periphery of the primary signal reception coil area by a first number of turns that may be less than one, and wherein the conductor of the secondary signal reception coil extends around the core of the secondary signal reception coil area by a second number of turns that is greater than 1.

46. The device of claim 45 wherein the first number of turns is greater than or equal to one.

47. The device of claim 45 wherein the second number of turns is at least 10 times the first number of turns.

48. The device of claim 45 wherein the second number of turns is at least 1000 times the first number of turns.

49. The device of claim 35 adapted for nuclear magnetic resonance (NMR) analysis of an object containing NMR-active nuclei and further comprising:
  a static field magnet providing a static magnetic field $B_0$ to the object, whereby at least a portion of the NMR-active nuclei in the object are aligned with the static magnetic field; and
  an excitation radio frequency (RF) power source electrically coupled to an excitation coil that subjects the object to a burst of RF energy at a frequency $\omega_{signal}$, whereby at least a portion of the NMR-active nuclei are excited into an excited state, wherein frequency $\omega_{signal}$ is the Larmor frequency of the NMR-active nuclei in the static magnetic field $B_0$;
  whereby the NMR-active nuclei in the excited state emit the alternating magnetic field $B_{signal}$ at frequency $\omega_{signal}$ as they return to their pre-excitation state.

50. The device of claim 35 adapted for magnetic resonance imaging (MRI) imaging of the object in one dimension x, and further comprising:
  a gradient field magnet that subjects the object to a gradient magnetic field B(x) whereby the Larmor frequencies of the NMR-active nuclei in the object fall within a range Larmor frequencies; and
  wherein the excitation RF power source is adapted to provide RF power at a plurality of frequencies in the range of Larmor frequencies.

* * * * *

UNITED STATES PATENT AND TRADEMARK OFFICE
CERTIFICATE OF CORRECTION

| | |
|---|---|
| PATENT NO. | : 7,146,282 B1 |
| APPLICATION NO. | : 11/124599 |
| DATED | : December 5, 2006 |
| INVENTOR(S) | : Daniel W. van der Weide et al. |

It is certified that error appears in the above-identified patent and that said Letters Patent is hereby corrected as shown below:

ON THE TITLE PAGE, Col. 1:

Please insert the following:
-- Prior Publication Data
      US 2006/0265139 A1      Nov. 23, 2006 --

IN THE SPECIFICATION

Col. 4, line 19:

Delete the word "stoop" before "$\omega_{loop} \approx \omega_{signal} +$".

Col. 4, line 41:

Delete the word "frequencyt" and replace it with --frequency--.

Col. 4, line 42:

Delete "$\omega_{mesh}$," and replace it with --$\omega_{mech}$,--.

Col. 5, line 29:

Delete the phrase "increase the number of turns on wire" and replace it with --increase the number of turns of wire--.

Col. 5, line 60:

Delete the phrase "provide an better noise floor" and replace it with --provide a better noise floor--.

Col. 10, line 11:

Delete the phrase "according [Eq. 4] below." and replace it with --according to [Eq. 4] below.--.

UNITED STATES PATENT AND TRADEMARK OFFICE
CERTIFICATE OF CORRECTION

PATENT NO. : 7,146,282 B1
APPLICATION NO. : 11/124599
DATED : December 5, 2006
INVENTOR(S) : Daniel W. van der Weide et al.

It is certified that error appears in the above-identified patent and that said Letters Patent is hereby corrected as shown below:

IN THE CLAIMS

Col. 20, line 59, Claim 34:

Delete the phrase "within a range Larmor frequencies;" and replace it with --within a range of Larmor frequencies;--.

Col. 22, line 55, Claim 50:

Delete the phrase "within a range Larmor frequencies;" and replace it with --within a range of Larmor frequencies;--.

Signed and Sealed this

Sixth Day of May, 2008

JON W. DUDAS
*Director of the United States Patent and Trademark Office*